US006635970B2

(12) United States Patent
Lasky et al.

(10) Patent No.: US 6,635,970 B2
(45) Date of Patent: Oct. 21, 2003

(54) POWER DISTRIBUTION DESIGN METHOD FOR STACKED FLIP-CHIP PACKAGES

(75) Inventors: Jerome B. Lasky, Essex Junction, VT (US); Edward J. Nowak, Essex Junction, VT (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/068,537

(22) Filed: Feb. 6, 2002

(65) Prior Publication Data

US 2003/0146517 A1 Aug. 7, 2003

(51) Int. Cl.$^7$ .......................... H01L 23/48; H01L 23/52; H01L 29/40
(52) U.S. Cl. .................... 257/777; 257/685; 257/686; 257/723; 257/724; 257/725; 257/778
(58) Field of Search ................ 257/777–778, 257/723–724, 686, 725, 685

(56) References Cited

U.S. PATENT DOCUMENTS

| | | | |
|---|---|---|---|
| 4,939,568 A | 7/1990 | Kato et al. | |
| 5,241,456 A | 8/1993 | Marcinkiewicz et al. | |
| 5,252,857 A | 10/1993 | Kane et al. | |
| 5,399,898 A | 3/1995 | Rostoker | |
| 5,440,453 A | 8/1995 | Cooke et al. | |
| 5,532,512 A | 7/1996 | Fillion et al. | |
| 5,612,570 A | 3/1997 | Eide et al. | |
| 5,737,192 A | 4/1998 | Linderman | |
| 5,760,478 A | 6/1998 | Bozso et al. | |
| 5,818,107 A | * 10/1998 | Pierson et al. | 257/723 |
| 5,861,666 A | 1/1999 | Bellaar | |
| 5,869,896 A | 2/1999 | Baker et al. | |
| 5,977,640 A | * 11/1999 | Bertin et al. | 257/777 |
| 5,998,864 A | 12/1999 | Khandros et al. | |
| 6,002,177 A | 12/1999 | Gaynes et al. | |
| 6,137,164 A | 10/2000 | Yew et al. | |
| 6,150,724 A | * 11/2000 | Wenzel et al. | 257/777 |
| 6,177,721 B1 | 1/2001 | Suh et al. | |
| 6,225,699 B1 | 5/2001 | Ference et al. | |
| 6,265,771 B1 | * 7/2001 | Ference et al. | 257/706 |
| 6,326,696 B1 | * 12/2001 | Horton et al. | 257/777 |
| 6,472,735 B2 | * 10/2002 | Isaak | 257/686 |
| 2001/0040793 A1 | * 11/2001 | Inaba | 361/749 |
| 2002/0074637 A1 | * 6/2002 | McFarland | 257/686 |
| 2002/0074668 A1 | * 6/2002 | Hofstee et al. | 257/777 |
| 2002/0185725 A1 | * 12/2002 | Moden et al. | 257/686 |

* cited by examiner

Primary Examiner—Stephen D. Meier
Assistant Examiner—Ida M. Soward
(74) Attorney, Agent, or Firm—Schmeiser, Olsen & Watts; William H. Steinberg (57) ABSTRACT

A chip-on-chip module and associated method of formation. First and second semiconductor chips are coupled together. The first chip comprises a first wiring layer and a first electrically conductive substrate on first and second sides, respectively, of the first chip. A supply voltage VDD is adapted to be electrically coupled to the second side of the first chip. The second chip comprises a second wiring layer and a second electrically conductive substrate on first and second sides, respectively, of the second chip. A ground voltage GND is adapted to be electrically coupled to the second side of the second chip. The first side of the first chip is electrically coupled to the first side of the second chip. The supply voltage VDD and the ground voltage GND are adapted to provide power to the first and second chips.

20 Claims, 5 Drawing Sheets

POWER DISTRIBUTION DESIGN METHOD FOR STACKED FLIP-CHIP PACKAGES

BACKGROUND OF THE INVENTION

1. Technical Field

The invention relates generally to semiconductor chip design, and more specifically, to a power distribution method for chip-on-chip packaging of semiconductor chips containing very large scale integrated circuit (VLSI) circuits, such as microprocessors and associated memory.

2. Related Art

Chip-on-chip module technology has facilitated increased system density and increased operating frequency by reducing interconnection distances and increasing signal propagation speed. However, these advances, and increased density of the integrated circuits on the chips themselves, have generally increased power consumption and heat generation per unit volume of packaging. Thus heat-dissipation can be problem or design limitation in chip-on-chip modules, especially those containing very large scale integrated (VLSI) circuits.

Multi-chip packages are becoming more widely used in the semiconductor industry owing to the need to achieve higher performance, lower power dissipation, and lower chip fabrication and packaging costs. Dual-chip stack packages using Controlled Collapse Chip Connection (C4) interconnects (DCSC4), such as the package depicted in FIG. 1A, provide a way to provide thousands of chip-chip interconnects while also providing sufficient cooling for a less-than 10 W stack, at a relatively low cost.

Figure 1A:
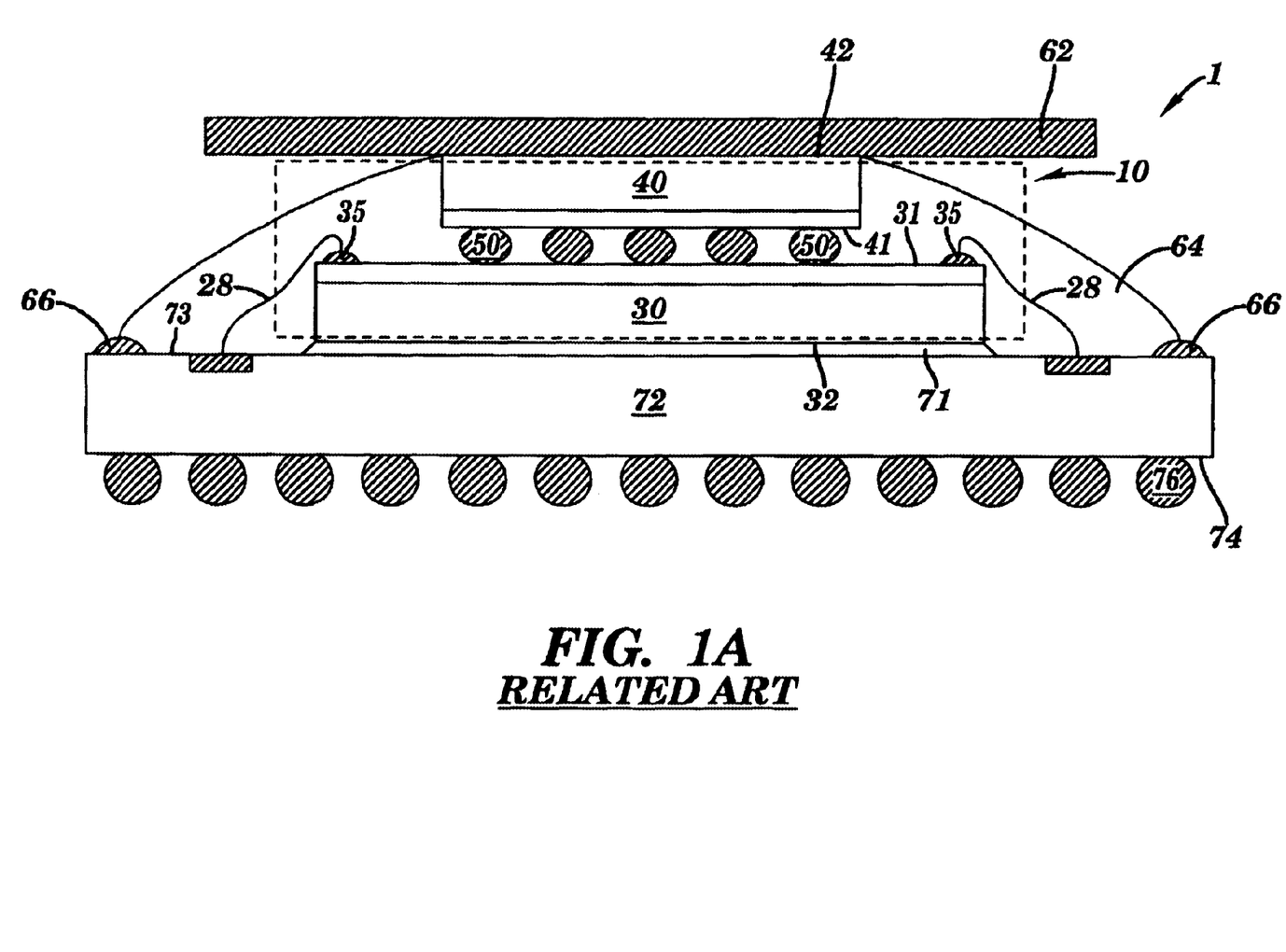
FIG. 1A is a cross-sectional view of a chip-on-chip package comprising a chip-on-chip module, in accordance with the related art.

FIG. 1A is a cross-sectional view of a chip-on-chip package 1 (e.g., a Dual Chip Stack package using C4 interconnections (DCSC4) package) of the related art. The chip-on-chip package 1 includes a chip-on-chip module 10 of the related art, as disclosed in FIG. 5 of commonly assigned U.S. Pat. No. 5,977,640 entitled Highly Integrated Chip-on-Chip Packaging, issued to Bertin, et al., and assigned to International Business Machines Corporation. Incorporated herein by reference are: commonly assigned U.S. Pat. No. 5,977,640; U.S. Ser. No. 09/105,382 entitled "Micro-flex Technology in Semiconductor Packages", by Bertin et al; and U.S. Pat. No. 6,225,699 entitled "Chip-on-Chip Interconnections of Varied Characteristics", by Ference et al.

The chip-on-chip module 10 comprises a master chip 30 and a slave chip 40. The master chip 30 has an active side 31 and a backside 32. The slave chip 40 has an active side 41 and a backside 42. Wirebonds 28 are connected to pads 35 on active side 31 of the master chip 30, and are connected to top side 73 of a package substrate 72. The bottom side 74 of package substrate 72 is coupled to solder balls 76 for connecting the chip-on-chip package 1 to a structure or device (e.g., to a different level of packaging). Adhesive 71 between the backside 32 of master chip 30 and the top side 73 of package substrate 72 mechanically connects chip-on-chip module 10 to package substrate 72. A resin dam 66 and encapsulant 64 protect the chips (i.e., master chip 30 and slave chip 40) and impart a durability to the wirebonds 28 and chip-on-chip package 1. Metal lid 62 enables the chip-on-chip package 1 to be compact, durable, and thermally-enhanced. Metal lid 62 can operate as a heat spreader that dissipates heat released from the chip-on-chip module 10. The adhesive 71, as well as any adhesive between the metal lid 62 and the backside 42 of the slave chip 40, may have a dielectric composition.

Figure 1B:
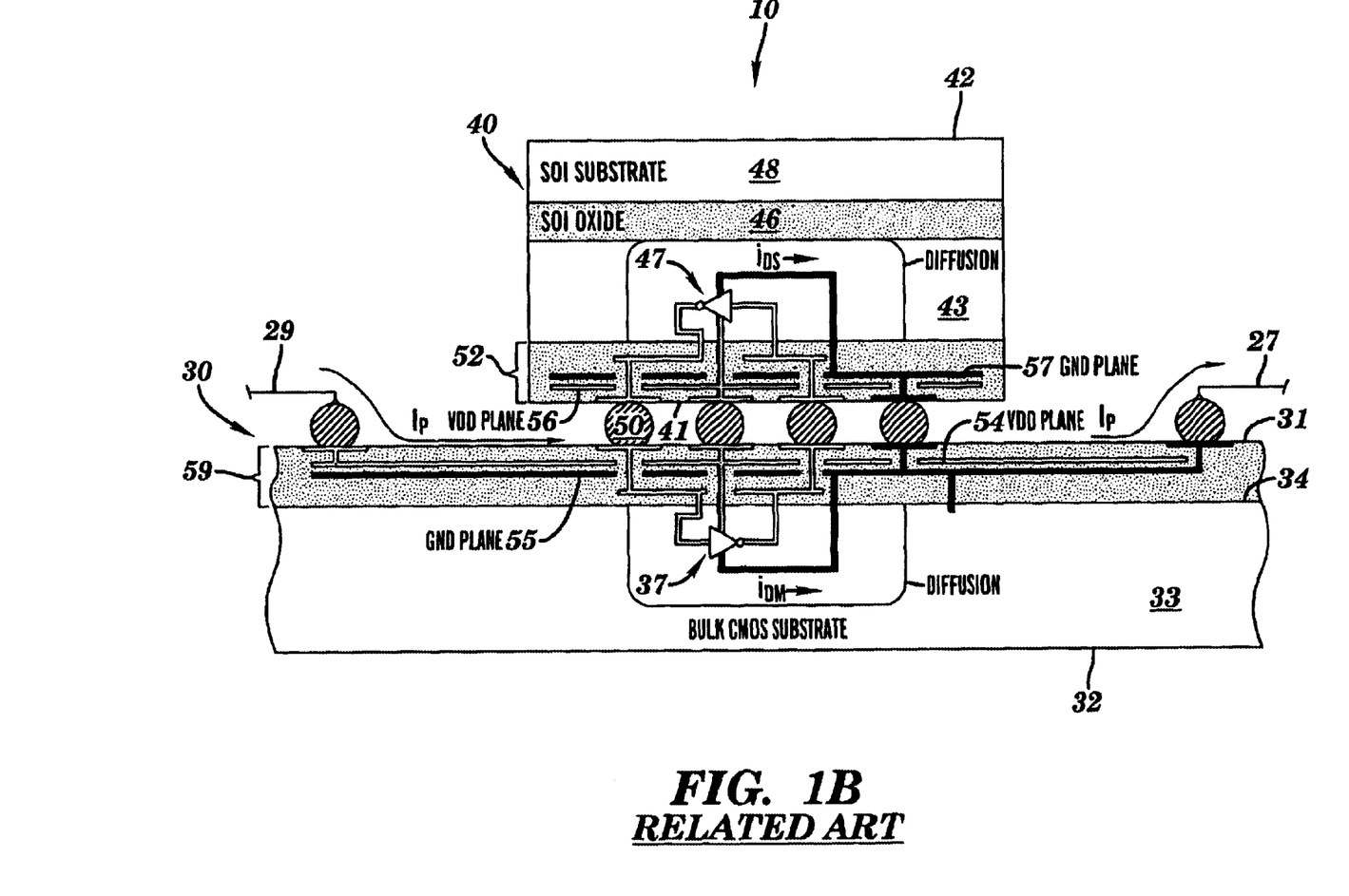
FIG. 1B is a detailed cross-sectional view of the chip-on-chip module of FIG. 1A.

FIG. 1B is a cross-sectional view of the chip-on-chip module 10 of FIG. 1A (shown without encapsulant 64). The chip-on-chip module 10 comprises master chip 30 and slave chip 40, fabricated in accordance with the related art. The (smaller) slave chip 40 is shown as fabricated in silicon-on-insulator (SOI) technology bonded (face to face) to the (larger) master chip 30 fabricated in bulk CMOS technology, wherein the external GND and VDD supply connections of the chip-on-chip module 10 (via wirebonds 27 and 29) are at the edge regions of the larger (master) chip 30. In the bulk CMOS technology (e.g., as on master chip 30), transistors are formed directly on the active surface 34 of a bulk semiconductor substrate (e.g., bulk semiconductor substrate 33). In the case of a SOI chip (e.g., slave chip 40), transistors are formed in a semiconductor layer 43 of semiconductor material (e.g., silicon) that is formed on an insulation layer 46 (e.g., $SiO_x$ or $Al_2O_3$) that is formed on a bulk semiconductor substrate 48 (e.g., silicon). In SOI chips of the related art, a substrate contact may be provided through the insulation layer 46 to conduct electrons between the bulk semiconductor substrate 48 and the semiconductor layer 43, and/or between the bulk semiconductor substrate 48 and one power plane for the purpose of preventing electrostatic charge from accumulating on either side of the insulation layer 46 in such a manner as to interfere with the operation of the device 47.

A portion of the electric power current (I) required to power the Chip-on-chip module 10 is delivered to the smaller chip (i.e., slave chip 40) for operation of devices (e.g. CMOS transistors, inverters, etc.) on the active side 41 of the smaller chip (i.e., slave chip 40). All the electric power current (I) is delivered to the devices 37 and 47 (e.g., semiconductor devices, indenters) on the chips in the conventional manner, e.g., through power planes (e.g., 54, 55, 56, 57) formed in metalization layers in the back-end-of-line (BEOL) layers; e.g., BEOL layers 59 and 52 of the master chip 30 and slave chip 40, respectively. For example, current ids provided to device 47 on the active side 41 of the smaller chip (i.e., the slave chip 40) is delivered at supply voltage VDD through wire 29 to the edge of the larger chip (i.e., the master chip 30) and though the VDD power plane 54 in the BEOL layer 59 of the master chip 30, through interconnections 50 (e.g., one or more solder balls) connecting master chip 30 to slave chip 40, then through the VDD power plane 56 in the BEOL layer 52 of the smaller chip (i.e., the slave chip 40), through the devices (e.g., device 47 such as an inverter) of the smaller chip (i.e., the slave chip 40), and out through the Ground (GND) power plane 57 in the BEOL layer 52 of the smaller chip (i.e., the slave chip 40), then through the interconnections 50 (e.g., solder balls) between the master chip 30 and the slave chip 40, then through the ground (GND) power plane 55 in the BEOL layer 59 of the master chip 30, and then through the ground wire 27.

Note that the VDD power planes 54 and 56, and GND power planes 55 and 57, especially in the slave chip 40, are compromised by the impedance (e.g., resistance) to the portion of current that must flow through interconnections 50 (e.g., a series of C4 connections) and wires 29 as well as through the power planes of master chip 30. Persons skilled in the art will recognize that the power planes of the master chip 30 are not as well-connected to devices (e.g., device 37) on the active surface 34 of master chip 30 in chip-on-chip module 10 as a single C4 chip in a ceramic single-chip package would be, because the interconnections 50 to the slave chip 40 prevents access points into and prevents power plane continuity in the center region of the master chip 30.

Advances in microprocessor chip technology have resulted in semiconductor chips comprising over a hundred million transistors running at frequencies greater than 1 Ghz, and have intense RAM memory bandwidth requirements. Two very high performance chips, such as chips containing a microprocessor and memory, can together consume power and release that energy as heat on the order of 100 watts, which can exceed the power-distribution and heat-dissipation capacity of DCSC4 designs of the related art. Future applications for compact modules, such as processors, workstations, graphics engines, speech recognition systems, network-connected game consoles, etc. will require extremely high bandwidth connections between a processor chip and a memory chip and may consume well over 100 W of power. The DCSC4 module shown in FIG. 1B is inadequate to provide a stable, low-impedance power supply to VLSI chips for these applications, and may not provide enough cooling for such a component. The problems of delivering sufficient useable electric power in, and getting all the heat byproduct out, are problems that must be solved before the advantages of DCSC4 packaging can be fully exploited for these high power applications.

In the vast majority of chip designs today, the power planes are basically two wiring mesh networks constructed within the back-end-of line (BEOL) metalization/wiring levels of each chip. These wiring mesh networks provide the ground (GND) connection and power supply voltage (VDD) to all of the devices (e.g. transistors) and circuits on the active side (e.g., 31 and 41) of each chip. For a chip (e.g., master chip 30) that is wirebonded to a package substrate (e.g., package substrate 72), these power planes can be connected to a relatively small number of redundant wire bond pads (e.g., pads 35 in FIG. 1A) on the active side 31 of the master chip 30, which after packaging may be connected to one or several external conductors of the package.

In higher performance, higher power chip designs, the resistance of the power supply planes in wirebond packages can result in so much "bounce" that circuits fail to operate properly. This a prime reason for designs moving into C4 packages, where, in general, many more power supply connections are available between the substrate and the chip, and which are distributed more evenly over the chip surface, thus creating lower power supply impedance. However, as extremely high performance chip groupings (e.g., microprocessor-memory modules) move to DCSC4 packages, the availability of a low-impedance power supply once again becomes a problem, since all connections external to the chip-on-chip package 1 must now come from the peripheral edges of the master chip 30.

Accordingly, there exists a need in the industry for a chip power distribution design capable of solving the above-mentioned problems.

SUMMARY OF THE INVENTION

A first aspect of the present invention provides a chip-on-chip module structure, comprising:

a first semiconductor chip comprising a first wiring layer on a first side of the first semiconductor chip and a first electrically conductive substrate on a second side of the first semiconductor chip, wherein the second side of the first semiconductor chip is adapted to be electrically coupled to a supply voltage VDD; and a second semiconductor chip comprising a second wiring layer on a first side of the second semiconductor chip and a second electrically conductive substrate on a second side of the second semiconductor chip, wherein the second side of the second semiconductor chip is adapted to be electrically coupled to a ground voltage GND, wherein the first side of the first semiconductor chip is electrically coupled to the first side of the second semiconductor chip, and wherein the first semiconductor chip and the second semiconductor chip are adapted to receive power from the supply voltage VDD and the ground voltage GND.

A second aspect of the present invention provides a method for forming a chip-on-chip module structure, comprising:

providing a first semiconductor chip, said first semiconductor chip comprising a first wiring layer on a first side of the first semiconductor chip and a first electrically conductive substrate on a second side of the first semiconductor chip, wherein the second side of the first semiconductor chip is adapted to be electrically coupled to a supply voltage VDD;

providing a second semiconductor chip, said second semiconductor chip comprising a second wiring layer on a first side of the second semiconductor chip and a second electrically conductive substrate on a second side of the second semiconductor chip, wherein the second side of the second semiconductor chip is adapted to be electrically coupled to a ground voltage GND; and electrically coupling the first side of the first semiconductor chip to the first side of the second semiconductor chip, wherein the first semiconductor chip and the second semiconductor chip are adapted to receive power from the supply voltage VDD and the ground voltage GND.

The chip-on-chip module of the present invention overcomes limitations of the related art. For example, the present invention improves interconnection density, increases the rate of heat dissipation, reduces electrical power consumption, and facilitates a more efficient delivery of electrical power into the chip-on-chip module.

DETAILED DESCRIPTION OF THE INVENTION

Figure 2:
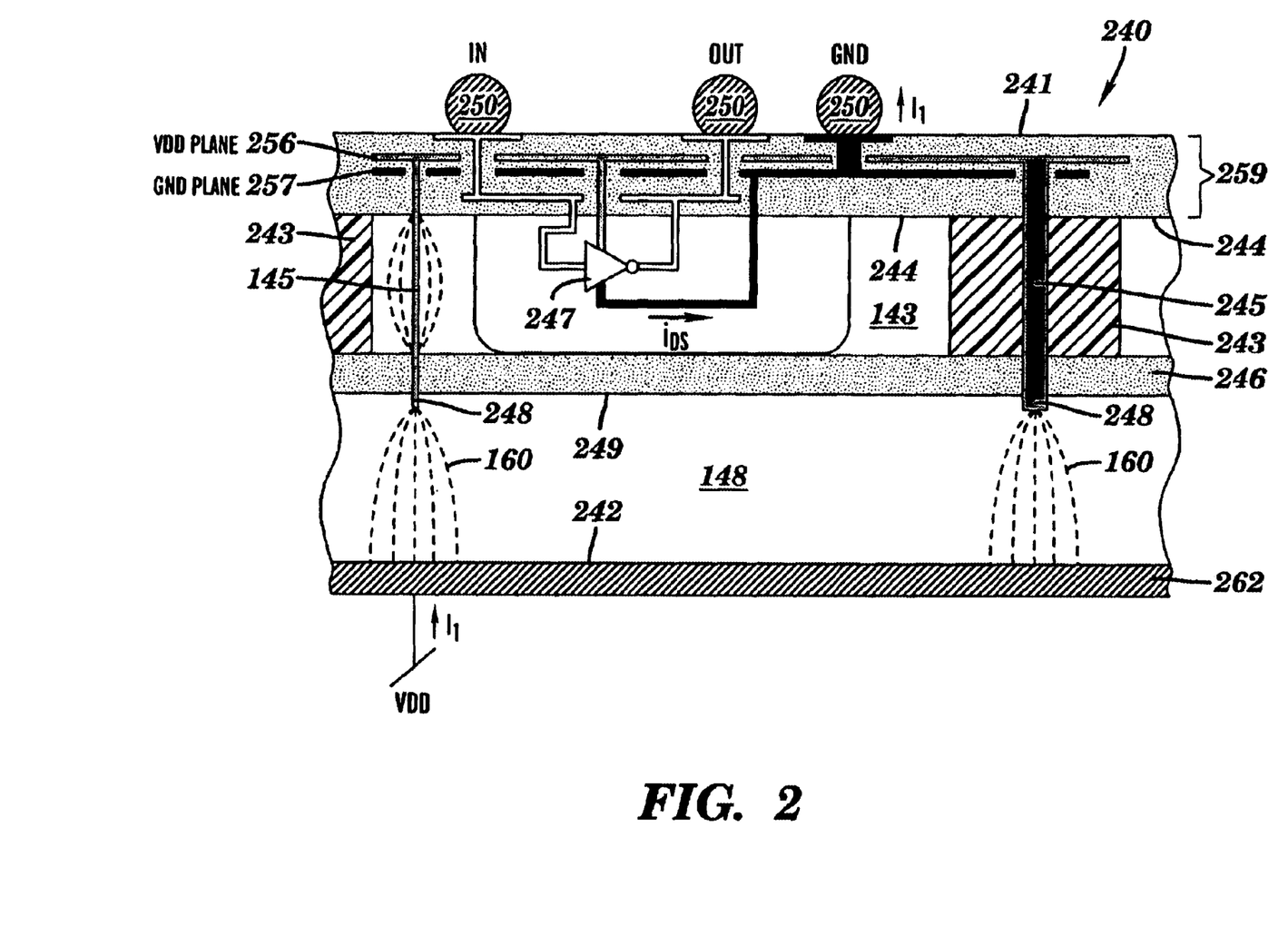
FIG. 2 is a cross-sectional view of a semiconductor-on-insulator (SCOI) chip having a power plane disposed on the backside of the SCOI chip such that the power plane is electrically coupled through the SCOI chip to a semiconductor device on the active side of the SCOI chip, in accordance with embodiments of the present invention.

FIG. 2 is a cross-sectional view of a semiconductor-on-insulator (SCOI) chip 240 and an external power plane (formed of a conductive layer 262) disposed on a surface 242 of a bulk semiconductor substrate 148 of the SCOI chip 240, in accordance with embodiments of the present invention. The conductive layer 262 may be both electrically conductive and thermally conductive. The surface 242 of the bulk semiconductor substrate 148 is also the backside of the SCOI chip 240. The bulk semiconductor substrate 148 is shown in FIG. 2 as being on the backside of the SCOI chip 240. The SCOI chip 240 may comprise a silicon-on-insulator (SOI) chip, or another semiconductor on-insulator chip. The SCOI chip 240 has a planar underlying bulk semiconductor substrate 148, a planar intermediate insulation layer 246 (e.g., an insulative dielectric layer), and an active layer comprising a plurality of "islands" of semiconductor substrate material of semiconductor layer 143 separated by shallow trench isolation (STI) 243. The SCOI chip 240 includes a plurality of power current-conducting vias (PCVs) (i.e., PCVs 145, 245, . . . ) extending between a plurality of low-impedance contacts 248 (on the inner face 249 of the bulk semiconductor substrate 148) and a back-end-of-line (BEOL) wiring layer 259 (e.g., ground (GND) power plane 257). The plurality of the PCVs (i.e., PCVs 145, 245, . . . ) can conduct the entire power current ($I_1$) needed to supply the SCOI chip 240 and/or another chip (see FIG. 4), or a part or parts of one chip or of each chip. As illustrated in FIG. 2, a portion of the power current ($I_1$) supplied to the backside 242 of the SCOI chip 240 may be used to power a plurality of semiconductor devices (e.g., device 247 as may be represented by a CMOS inverter) that are fabricated on the opposite active side 241 of the SCOI chip 240. The BEOL wiring layer 259 is shown in FIG. 2 as being on the active side 241 of the SCOI chip 240. The external power plane formed of conductive layer 262 is electrically connected to a power supply (VDD) and is coupled, by passage of electric currents 160 though the bulk semiconductor substrate 148, to an internal power plane (e.g., VDD power plane 256) within the BEOL wiring layer 259.

The external power plane formed of conductive layer 262, which is disposed on the backside 242 of the SCOI chip 240, may comprise a metal layer (e.g., the metal lid 62 in FIG. 1A) that is electrically connected (through the bulk semiconductor substrate 148) to the device 247 (e.g., a semiconductor device) on the active side 244 of the SCOI chip 240. The conductive layer 262 may be in electrical contact and conformal physical contact with the backside 242 of the SCOI chip 240. Accordingly, any adhesive disposed between the conductive layer 262 and the backside 242 of the SCOI chip 240 may be a thermally and electrically conducting composition, and not a dielectric composition.

The power current-conducting vias PCVs (i.e., PCVs 145, 245, . . . ) extend from the low-impedance contacts 248 through the insulative/dielectric layers or regions (e.g., insulation layer 246 and STI 243) and/or semiconducting materials of semiconductor layer 143, to a power plane (e.g., VDD power plane 256) or to other conductors in the BEOL wiring layer 259, and/or all the way through the BEOL wiring layer 259 to the exterior surface on the active side 241 of the SCOI chip 240. If the bulk semiconductor substrate 148 is sufficiently doped and the low-impedance contact 248 is provided (e.g., by the process technology), then any interconnections 250 (e.g., C4 solder balls) to the supply voltage (e.g., to VDD) are not needed for the operation of that SCOI chip 240. Sufficiently doped means doped sufficiently, in consideration of the VDD and GND connections, to conduct the power current ($I_1$) (represented as the current 160 in the bulk semiconductor substrate 148) from backside 242 of the SCOI chip 240 to the active side 241 of the SCOI chip 240. The connection of supply voltage VDD to the VDD power plane 256 in the BEOL wiring layers 259 can be made by contacting the backside 242 of the SCOI chip 240 to VDD.

As illustrated in FIG. 2, the use of the external power plane (formed of conductive layer 262) to supply a power current ($I_1$) at the supply voltage VDD eliminates the conventional need for any external interconnections 250 to supply the same power into the SCOI chip 240. For example, C4 connectors for VDD are obviated, unless needed to supply VDD to an adjacent flip-chip as in FIG. 4. In various alternative embodiments, the external power plane (formed of conductive layer 262) that is electrically coupled to the bulk semiconductor substrate 148 can be electrically tied to either the logic High voltage (VDD) or to the logic Low voltage (GND) power plane of the SCOI chip 240.

The power current-conducting vias PCVs (i.e., PCVs 145, 245, . . . ) may be constructed by any processes known to one of ordinary skill in the art so as to extend either through the dielectric material of the STI 243 (e.g., PCV 245) or through a semiconductor "island" (e.g., PCV 145 may extend through bulk semiconductor material of semiconductor layer 143 which includes a device 247 such as a semiconductor device, inverter, etc. and is bounded by the STI 243). The power current-conducting vias PCVs (i.e., PCVs 145, 245, . . . ) can be formed by known mechanical, chemical, and/or lithographic techniques, such as reactive ion etching (RIE), drilling, etc followed by filling with a conductive material (e.g., a metal or alloy such as TiN and/or W), with subsequent annealing as necessary.

Figure 3:
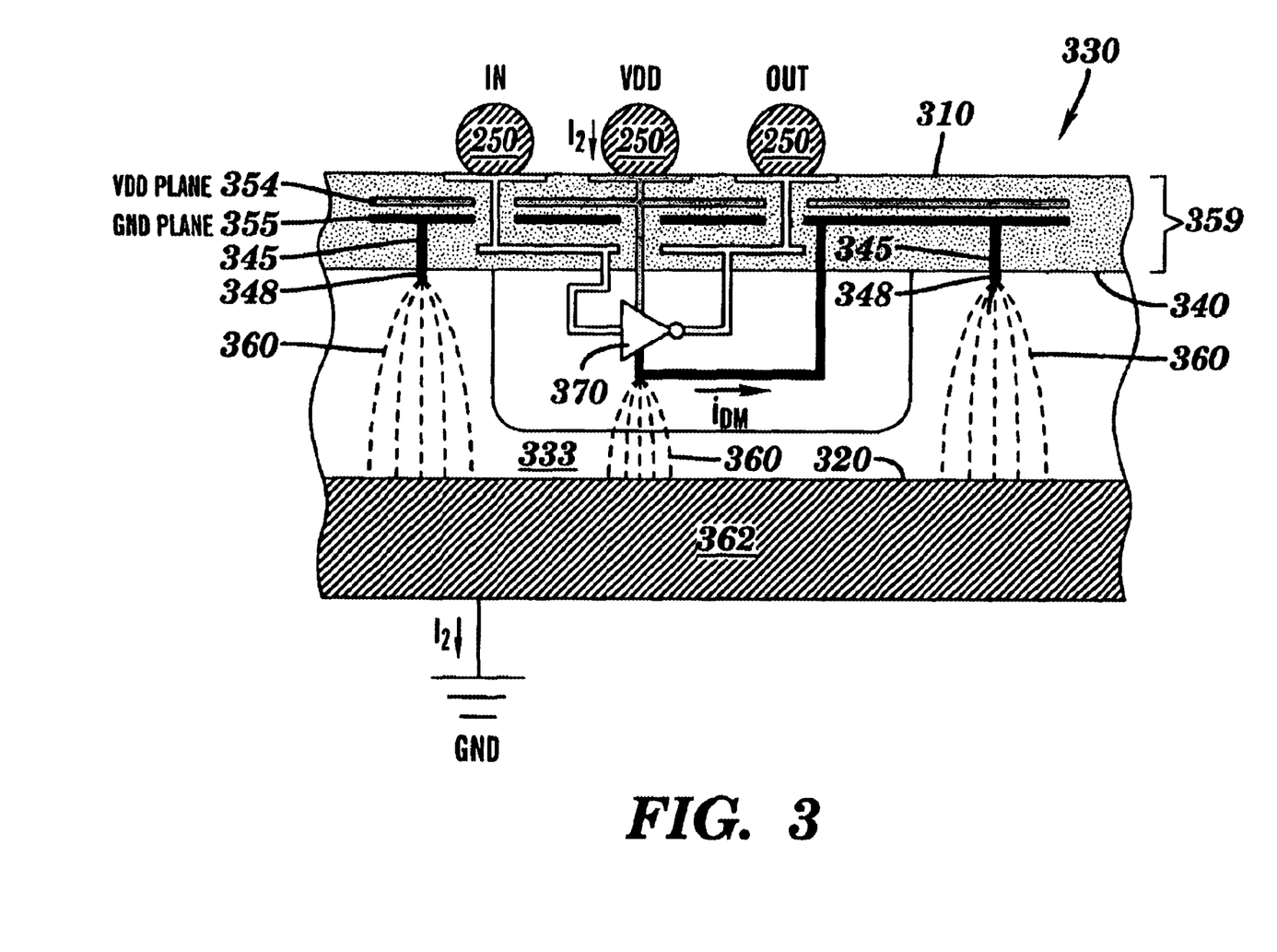
FIG. 3 is a cross-sectional view of a bulk semiconductor chip having a power plane disposed on the backside of the bulk semiconductor chip such that the power plane is electrically connected through the bulk semiconductor chip to a semiconductor device on the active side of the bulk semiconductor chip, in accordance with embodiments of the invention.

FIG. 3 is a cross-sectional view of a bulk semiconductor chip 330 and an external power plane (formed of a conductive layer 362) disposed on a on a surface 320 of a bulk semiconductor substrate 333 of the bulk semiconductor chip 330, in accordance with embodiments of the present invention. The conductive layer 362 may be both electrically conductive and thermally conductive. The surface 320 of the bulk semiconductor substrate 333 is also the backside of the bulk semiconductor chip 330. The bulk semiconductor substrate 333 is shown in FIG. 3 as being on the backside of the bulk semiconductor chip 330. The bulk semiconductor chip 330 has an internal power-distribution structure as shown. The bulk semiconductor chip 330 comprises the planar bulk semiconductor substrate 333. The bulk semiconductor substrate 333 has an active surface 340 on an active side 310 of the bulk semiconductor chip 330. Supporting devices are built into the active surface 340 on the active side 310. The bulk semiconductor chip 330 comprises a plurality of low-impedance contacts 348 on the active surface 340. The bulk semiconductor chip 330 also comprises a plurality of power current-conducting vias PCVs (i.e., PCVs 345) extending between a power plane (e.g., GND power plane 355 in a BEOL wiring layer 359) and the plurality of low-impedance contacts 348. The plurality of the PCVs (i.e., PCVs 345) can conduct the entire power current ($I_2$) needed to supply the bulk semiconductor chip 330 and/or another chip (see FIG. 4), or a part or parts of the bulk semiconductor chip 330 and/or the another chip.

As illustrated in FIG. 3, a portion of the power current ($I_2$) supplied to the backside 320 of the bulk semiconductor chip 330 may be used to power a device 370 (e.g., a semiconductor as represented by a CMOS inverter; an inverter; a passive device such as an inductor or capacitor, etc.) that is fabricated on the active side 310 of the bulk semiconductor chip 330. The BEOL wiring layer 359 is shown in FIG. 3 as being on the active side 310 of the bulk semiconductor chip 330. The external power plane formed of a conductive layer 362 is electrically coupled to a power supply voltage (e.g., VDD) or to GND and is coupled, by passage of electric currents 360 through the bulk semiconductor substrate 333 to an internal power plane (e.g., VDD power plane 354 within the BEOL wiring layer 359).

The external power plane formed of a conductive layer 362, disposed on the backside 320 of the bulk semiconductor chip 330, may comprise a metal layer (e.g., a metal lid such as the metal lid 62 in FIG. 1A) that is electrically connected (through the bulk semiconductor substrate 333) to the device 370 on the active surface 340 of the bulk semiconductor chip 330. The conductive layer 362 may be in electrical contact and conformal physical contact with the backside 320 of the bulk semiconductor chip 330. Accordingly, any adhesive disposed between the conductive layer 362 and the backside 320 of the bulk semiconductor chip 330 may be a thermally and electrically conducting composition, and not a dielectric composition.

The power current-conducting vias PCVs (i.e., PCVs 345) extend from the low-impedance contacts 348 through the BEOL wiring layer 359 of the bulk semiconductor chip 330, to a power plane (e.g., VDD power plane 354) or to other conductors in the BEOL wiring layer 359, and/or all the way through the BEOL wiring layer 359 to the exterior surface on the active side 310 of the bulk semiconductor chip 330. If the bulk semiconductor substrate 333 is sufficiently doped and the low-impedance contact 348 is provided (e.g., by the process technology), then any interconnections 250 (e.g., C4 solder balls) to the supply voltage (e.g., to VDD) are not needed for the operation of the bulk semiconductor chip 330. Sufficiently doped means doped sufficiently, in consideration of the VDD and GND connections, to conduct the power current ($I_2$) (represented as the current 360 in the bulk semiconductor substrate 333) from backside 320 of the bulk semiconductor chip 330 to the active side 310 of the bulk semiconductor chip 330. The connection of ground (GND) voltage to the GND power plane 355 in BEOL wiring layers 359 of the bulk semiconductor chip 330 can be made by contacting the backside 320 of the bulk semiconductor chip 330 to GND.

As illustrated in FIG. 3, use of the external power plane (formed of conductive layer 362) to supply a power current ($I_2$) at a ground (GND) voltage eliminates the conventional need for any external interconnections 250 to supply the same power into the bulk semiconductor chip 330. For example, C4 connectors for VDD are obviated, unless needed to supply VDD to an adjacent flip-chip, as in FIG. 4. In various alternative embodiments, the external power plane (formed of conductive layer 362) that is electrically connected to the bulk semiconductor substrate 333 can be electrically tied to either the logic High voltage (VDD) or to the logic Low voltage (GND) power plane of the bulk semiconductor chip 330. The power current-conducting vias PCVs (i.e., PCVs 345) may be constructed by processes known to one of ordinary skill in the art.

Figure 4:
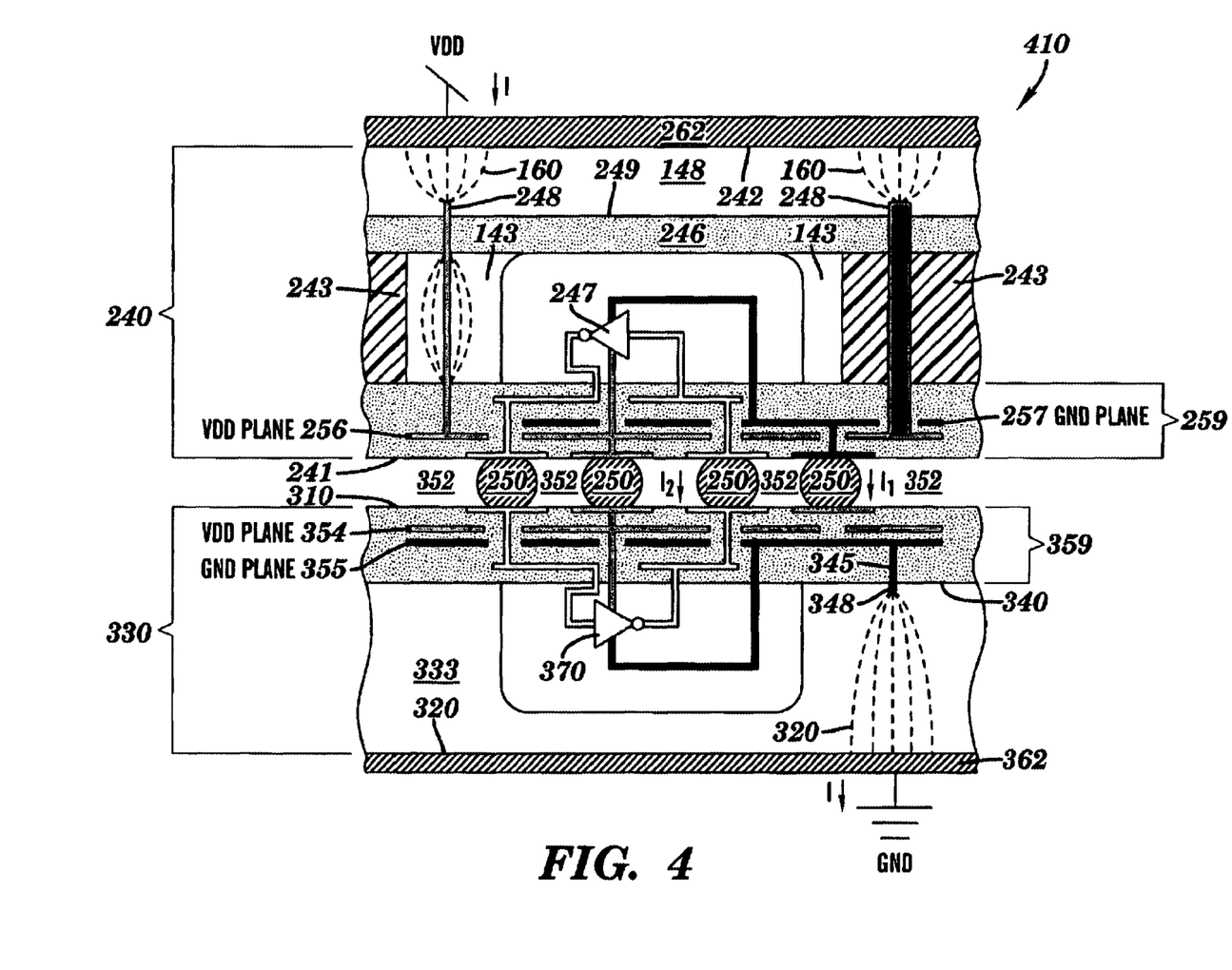
FIG. 4 is a cross-section of a portion of a chip-on-chip module formed by a flip-chip attachment of the bulk semiconductor chip of FIG. 3 to the SCOI chip of FIG. 2.

FIG. 4 is a cross-section of a portion of a chip-on-chip module 410 formed by the flip-chip attachment of the bulk semiconductor chip 330 of FIG. 3 to the SCOI chip 240 of FIG. 2. The module 410 comprises a plurality of interconnections 250 (e.g., C4 solder balls) for interconnecting a device (e.g., the semiconductor device 247) on the SCOI chip 240 to a device (e.g., the device 370) on the bulk semiconductor chip 330. A resin dam (see, e.g., resin dam 66 in FIG. 1A) and dielectric encapsulant (see e.g., encapsulant 64 in FIG. 1A) may fill the spaces 352 between the interconnections 250 to protect the chips 330 and 240 and to provide durability to the chip-on-chip module 410.

Conductive layer 262 on the backside 242 of the SCOI chip 240 may be a metal lid that provides an electrical contact for the chip-on-chip module 410 to a supply voltage (e.g., VDD or GND), and is in electrical contact with the material of the bulk semiconductor substrate 148 and with one or more power planes in chips 330 and 240. The conductive layer 262 may comprise a thermally conductive material (e.g., a metal that is both electrically conductive and thermally conductive) that enables the conductive layer 262 to operate as a heat spreader that dissipates heat generated within the SCOI chip 240. Any adhesive between the conductive layer 262 and the backside 242 of the SCOI chip 240 may include an electrically and thermally conductive composition.

Conductive layer 362 on the backside 320 of the bulk semiconductor chip 330 may be a metal lid that provides an electrical contact for the chip-on-chip module 410 to a supply voltage (e.g., VDD or GND), and is in electrical contact with the material of the bulk semiconductor substrate 333 and with one or more power planes in chips 330 and 240. The conductive layer 362 may comprise a thermally conductive material (e.g., a metal that is both electrically conductive and thermally conductive) that enables the conductive layer 362 to operate as a heat spreader that dissipates heat generated within the bulk semiconductor chip 330. Any adhesive between the conductive layer 362 and the backside 333 of the bulk semiconductor chip 330 may include an electrically and thermally conductive composition.

Some or all of the electric power current (I) required provide power in the module 410 to the SCOI chip 240 (for operation of a device therein such as the semiconductor device 247) and/or the bulk semiconductor chip 330, may be conducted through the bulk semiconductor substrate 148 and/or 333 of chips 240 and 330, respectively. See currents 160 and 360 in the bulk semiconductor substrates 148 and 333 in FIGS. 2 and 3, respectively. The semiconductor device 247 may include, inter alia, CMOS transistors, inverters, etc. All the electric power current (I) may be delivered through power planes (e.g., VDD power plane 354, GND power plane 355, VDD power plane 256, GND power plane 257) formed in metalization layers in the BEOL wiring layers 259 and 359 of the SCOI chip 240 and the bulk semiconductor chip 330, respectively. A first portion (e.g., $I_1$) of the power current (I) may be used to power the devices (e.g., the semiconductor device 247) on SCOI chip 240, while a second portion (e.g., $I_2$) of the power current (I) may be used (in parallel) to power the devices (e.g., the device 370) on the bulk semiconductor chip 330, such that $I=I_1+I_2$.

The device 370 may be a semiconductor as represented by a CMOS inverter; an inverter; a passive electrical device such as an inductor or capacitor, etc. If the only electrical devices comprised by the bulk semiconductor chip 330 are passive electrical devices, then the bulk semiconductor chip 330 is described herein a "passive device semiconductor chip." Aside from not comprising electrical devices which are not passive electrical devices, the present invention includes all of the features of the bulk semiconductor chip 330 relating to the present invention (e.g., the PCVs 345).

In alternative embodiments, the bulk semiconductor chip 330 within a module has two operating voltages: a first voltage and a second voltage. The first voltage is a "core" voltage that is associated with the "core" of the bulk semiconductor chip 330. The second voltage is higher than the core voltage and the second voltage may be used for, inter alia, driving interfacing circuits along the perimeter edge of the bulk semiconductor chip 330. The power planes within the "core" of the bulk semiconductor chip 330 may be supplied with current through the substrate(s) of the module's chips in the manner disclosed herein, while other power planes of the bulk semiconductor chip 330 may be powered by current supplied in the conventional manner (e.g., through wirebonds) through contacts on the active side 310 of the bulk semiconductor chip 330.

In alternative embodiments, the power current I, or a portion $I_S$ thereof, transmitted through the SCOI chip 240 and the bulk semiconductor chip 330 could be used to power devices (e.g., semiconductor devices 247 and 370) on the SCOI chip 240 and the bulk semiconductor chip 330, such that the current I or $I_S$ flows in series through the devices of the SCOI chip 240 and then through the devices of the bulk semiconductor chip 330. In such alternative embodiments, a power supply voltage approximately equal to the sum of the operating voltages of said devices (e.g., VDD+VDD associated with semiconductor device 247 and 370 in chips 240 and 330, respectively, in FIG. 4) would be connected to the conductive layer 262 on the backside 242 of the SCOI chip 240, while the ground(GND) voltage would be connected to the conductive layer 362 on the backside 320 of the bulk semiconductor chip 330. In such alternative embodiments, electrical (e.g., voltage) isolation, such as optoisolation, between inputs and outputs of devices on each chip may necessary. In such alternative embodiments, one or more voltage regulators and/or current-bypass circuits connected in electrical parallel with each chip may be beneficial. In this manner, the devices on one chip (or a subset thereof) may be operated at a first voltage, while the devices on the second chip (or a subset thereof) may be operated at a second voltage (which may be unequal to the first voltage), such that only one power supply voltage need be provided to the chip-on-chip module 410.

While FIG. 4 depicts the chip-on-chip module 410 as having the SCOI chip 240 solderably coupled to the bulk semiconductor chip 330, various variants of FIG. 4 are within the scope of the present invention.

In a first variant of FIG. 4, the bulk semiconductor chip 330 could be replaced by a second SCOI chip, resulting in a chip-on-chip module that comprises a first SCOI chip (e.g., the SCOI chip 240) solderably coupled to the second SCOI chip (e.g., a SCOI chip having the same characteristics stated herein, including power conducting vias, for the SCOI chip 240). Either or both of the first and second SCOI chips could be a SOI chip.

In a second variant of FIG. 4, the SCOI chip 240 could replaced by a second bulk semiconductor chip, resulting in a chip-on-chip module that comprises a first bulk semiconductor chip (e.g., the bulk semiconductor chip 330) solderably coupled to the second bulk semiconductor chip (e.g., a bulk semiconductor chip having the same characteristics stated herein, including power conducting vias, for bulk semiconductor chip 330). The bulk semiconductor substrates of the first and second bulk semiconductor chips must have dopings of opposite polarity in order for said substrates to be sufficiently conducting in light of the VDD and GND connections. In particular, with the first bulk semiconductor chip (e.g., the bulk semiconductor chip 330) coupled to GND and the second bulk semiconductor chip coupled to VDD, the bulk semiconductor substrate of the first bulk semiconductor chip has p-type doping and the bulk semiconductor substrate of the second bulk semiconductor chip has n-type doping.

In a third variant of FIG. 4, the SCOI chip 240 could replaced by a first passive device semiconductor chip, resulting in a chip-on-chip module that comprises the first passive device semiconductor chip solderably coupled to the bulk semiconductor chip 330. Since the backside of the first passive device semiconductor chip is electrically coupled to VDD and the backside 320 of the bulk semiconductor chip 330 is electrically coupled to GND, the bulk semiconductor substrate of the first passive device semiconductor chip includes n-type doping and the bulk semiconductor substrate 333 of the bulk semiconductor chip 330 includes p-type doping. Alternatively, if the backside of the first passive device semiconductor chip were instead electrically coupled to GND and the backside 320 of the bulk semiconductor chip 330 were instead electrically coupled to VDD, then the bulk semiconductor substrate of the first passive device semiconductor chip would include p-type doping and the bulk semiconductor substrate 333 of the bulk semiconductor chip 330 would include n-type doping.

A fourth variant of FIG. 4, is derived from the third variant of FIG. 4 such the bulk semiconductor chip 330 is replaced by a second passive device semiconductor chip, resulting in a chip-on-chip module that comprises the first passive device semiconductor chip solderably coupled to the second passive device semiconductor chip. Since the backside of the first passive device semiconductor chip is electrically coupled to VDD and the backside of the second passive device semiconductor chip is coupled to GND, the bulk semiconductor substrate of the first passive device semiconductor chip includes n-type doping and the bulk semiconductor substrate of the second passive device semiconductor chip includes p-type doping.

In a fifth variant of FIG. 4, the bulk semiconductor chip 330 could be replaced by a passive device semiconductor chip, resulting in a chip-on-chip module that comprises the SCOI chip 240 solderably coupled to the passive device semiconductor chip. Since the backside of the passive device semiconductor chip is coupled to GND, the bulk semiconductor substrate of the passive device semiconductor chip includes p-type doping. Alternatively, if the backside of the passive device semiconductor chip were instead electrically coupled to VDD, then the bulk semiconductor substrate of the passive device semiconductor chip would include n-type doping.

FIG. 4 may be viewed as depicting a chip-on-chip module structure that comprises the chip-on-chip module 410, VDD and GND, wherein the chip-on-chip module 410 is coupled to VDD and GND as described supra.

While the invention has been shown and described with reference to specific embodiments thereof, it will be understood by those skilled in the art that the foregoing and other modifications or variations in form, materials, and detail may be made therein without departing from the spirit and scope of the invention. Therefore, the following claims should be studied to determine the true scope and content of the invention.

We claim:

1. A chip-on-chip module structure, comprising:
a first semiconductor chip comprising a first wiring layer and a first electrically conductive substrate, wherein the first wiring layer is within a first portion of the first semiconductor chip, wherein the first electrically conductive substrate is within a second portion of the first semiconductor chip, wherein a bounding surface of the first portion of the first semiconductor chip is coplanar with a first exterior surface of the first semiconductor chip, wherein a bounding surface of the second portion of the first semiconductor chip is coplanar with a second exterior surface of the first semiconductor chip, wherein the bounding surface of the second portion of the first semiconductor chip is electrically coupled to a supply voltage VDD by a first electrically conductive path disposed between the supply voltage VDD and the surface of the second portion of the first semiconductor chip, and wherein the first electrically conductive path does not pass through any portion of the first semiconductor chip; and a second semiconductor chip comprising a second wiring layer and a second electrically conductive substrate, wherein the second wiring layer is within a first portion of the second semiconductor chip, wherein the second electrically conductive substrate is within a second portion of the second semiconductor chip, wherein a bounding surface of the first portion of the second semiconductor chip is coplanar with a first exterior surface of the second semiconductor chip, wherein a bounding surface of the second portion of the second semiconductor chip is coplanar with a second exterior surface of the second semiconductor chip, wherein an interconnection layer is disposed between the first semiconductor chip and the second semiconductor chip, and wherein the interconnection layer electrically couples the first semiconductor chip to the second semiconductor chip, and wherein the interconnection layer, wherein the bounding surface of the second portion of the second semiconductor chip is electrically coupled to a ground voltage GND by a second electrically conductive path disposed between the ground voltage GND and the surface of the second portion of the second semiconductor chip, wherein the second electrically conductive path does not pass through any portion of the second semiconductor chip, and wherein the supply voltage VDD and the ground voltage GND collectively provide power to the first and second semiconductor chips.

2. The chip-on-chip module structure of claim 1, further comprising:

a first electrically conductive layer disposed on and in electrical contact with the bounding surface of the second portion of the first semiconductor chip, wherein the first electrically conductive layer is electrically coupled to the supply voltage VDD, and wherein the first electrically conductive path passes through the first electrically conductive layer; and a second electrically conductive layer disposed on and in electrical contact with the bounding surface of the second portion of the second semiconductor chip, wherein the second electrically conductive layer is electrically coupled to the ground voltage GND, and wherein the second electrically conductive path passes through the second electrically conductive layer.

3. The chip-on-chip module structure of claim 2, wherein the first electrically conductive layer is sufficiently thermally conductive to dissipate heat generated in the first semiconductor chip, and wherein the second electrically conductive layer is sufficiently thermally conductive to dissipate heat generated in the second semiconductor chip.

4. The chip-on-chip module structure of claim 1, wherein the first semiconductor chip is a semiconductor-on-insulator (SCOI) chip, and wherein the second semiconductor chip is a bulk semiconductor chip.

5. The chip-on-chip module structure of claim 1, wherein the first semiconductor chip is a first SCOI chip, wherein the first electrical device is a first semiconductor device, wherein the second semiconductor chip is a second SCOI chip, and wherein the second electrical device is a second semiconductor device.

6. The chip-on-chip module structure of claim 1, wherein the first semiconductor chip is a first bulk semiconductor chip, and wherein the second semiconductor chip is a second bulk semiconductor chip.

7. The chip-on-chip module structure of claim 1, wherein the first semiconductor chip is a passive device semiconductor chip, and wherein the second semiconductor chip is selected from the group consisting of a SCOI chip and a bulk semiconductor chip.

8. The chip-on-chip module structure of claim 1, wherein the first semiconductor chip is selected from the group consisting of a SCOI chip and a bulk semiconductor chip, and wherein the second semiconductor chip is a passive device semiconductor chip.

9. The chip-on-chip module structure of claim 1, wherein the first semiconductor chip further comprises a first power conducting via and a first electrical device, wherein the first wiring layer is a first back-end-of-line (BEOL) wiring layer, wherein a bounding surface of the first electrically conductive substrate is coplanar with the bounding surface of the second portion of the first semiconductor chip, wherein the first electrically conductive substrate is a first bulk semiconductor substrate that is sufficiently doped to conduct a first electrical current between the first electrically conductive layer and the first power conducting via, wherein the first power conducting via electrically couples the first bulk semiconductor substrate to the first BEOL wiring layer, and wherein the first BEOL wiring layer is adapted to conduct a portion of the first electrical current into the first electrical device; and wherein the second semiconductor chip further comprises a second power conducting via and a second electrical device, wherein the second wiring layer is a second back-end-of-line (BEOL) wiring layer, wherein a bounding surface of the second electrically conductive substrate is coplanar with the bounding surface of the second portion of the second semiconductor chip, wherein the second electrically conductive substrate is a second bulk semiconductor substrate that is sufficiently doped to conduct a second electrical current between the second electrically conductive layer and the second power conducting via, wherein the second power conducting via electrically couples the second bulk semiconductor substrate to the second BEOL wiring layer, and wherein the second BEOL wiring layer is adapted to conduct a portion of the second electrical current into the second electrical device.

10. The chip-on-chip module structure of claim 9, wherein the first electrically conductive path does not include any solder interconnection, and wherein the second electrically conductive path does not include any solder interconnection.

11. The chip-on-chip module structure of claim 2, wherein the first electrically conductive path does not include any solder interconnection, and wherein the second electrically conductive path does not include any solder interconnection.

12. The chip-on-chip module structure of claim 2, wherein the first electrically conductive layer is a thermally conductive layer.

13. The chip-on-chip module structure of claim 2, wherein the first electrically conductive layer is a first thermally conductive layer, and wherein the second electrically conductive layer is a second thermally conductive layer.

14. The chip-on-chip module structure of claim 2, wherein a first electrically conductive adhesive is disposed between the first electrically conductive layer and the bounding surface of the second portion of the first semiconductor chip.

15. The chip-on-chip module structure of claim 14, wherein the first electrically conductive layer is a thermally conductive layer, wherein the first electrically conductive adhesive is a thermally conductive adhesive.

16. The chip-on-chip module structure of claim 14, wherein a second electrically conductive adhesive is disposed between the second electrically conductive layer and the bounding surface of the second portion of the second semiconductor chip.

17. The chip-on-chip module structure of claim 16, wherein the first electrically conductive layer is a first thermally conductive layer, wherein the first electrically conductive adhesive is a first thermally conductive adhesive, wherein the second electrically conductive layer is a second thermally conductive layer, and wherein the second electrically conductive adhesive is a second thermally conductive adhesive.

18. The chip-on-chip module structure of claim 2, wherein the first electrically conductive layer comprises a metal.

19. The chip-on-chip module structure of claim 2, wherein the first electrically conductive layer does not comprises a metal.

20. The chip-on-chip module structure of claim 2, wherein the first electrically conductive layer comprises a metal, and wherein the second electrically conductive layer does not comprises a metallic material.

* * * * *